US009166146B2

(12) United States Patent
Wang et al.

(10) Patent No.: US 9,166,146 B2
(45) Date of Patent: Oct. 20, 2015

(54) ELECTRIC FIELD ASSISTED MRAM AND METHOD FOR USING THE SAME

(71) Applicant: Avalanche Technology Inc., Fremont, CA (US)

(72) Inventors: Zihui Wang, Milpitas, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 54 days.

(21) Appl. No.: 14/166,813

(22) Filed: Jan. 28, 2014

(65) Prior Publication Data

US 2014/0247653 A1 Sep. 4, 2014

Related U.S. Application Data

(60) Provisional application No. 61/771,523, filed on Mar. 1, 2013.

(51) Int. Cl.
*G11C 11/00* (2006.01)
*H01L 43/08* (2006.01)
*G11C 11/16* (2006.01)

(52) U.S. Cl.
CPC .............. *H01L 43/08* (2013.01); *G11C 11/16* (2013.01); *G11C 11/161* (2013.01)

(58) Field of Classification Search
CPC .... G11C 11/15; G11C 11/16; G11C 11/5678; G11C 11/161

USPC ............................................ 365/158, 171, 173
See application file for complete search history.

(56) References Cited

U.S. PATENT DOCUMENTS

| 8,513,749 B2 * | 8/2013 | Chen et al. ..................... 257/421 |
| 9,007,818 B2 * | 4/2015 | Sandhu et al. ................. 365/158 |
| 2014/0301135 A1 * | 10/2014 | Guo ............................. 365/158 |

OTHER PUBLICATIONS

Wang et al.,"Electric-field-assisted switching in magnetic tunnel junctions," Nature Materials, Nov. 13, 2011, pp. 1-5 (Advance Online Publication: www.nature.com/naturematerials).

* cited by examiner

*Primary Examiner* — Gene Auduong
(74) *Attorney, Agent, or Firm* — Bing K. Yen

(57) ABSTRACT

The present invention is directed to a spin transfer torque magnetic random access memory (STT-MRAM) device having a plurality of memory elements. Each of the plurality of memory elements comprises a magnetic reference layer with a first invariable magnetization direction substantially perpendicular to layer plane thereof; a magnetic free layer separated from the magnetic reference layer by an insulating tunnel junction layer with the magnetic free layer having a variable magnetization direction substantially perpendicular to layer plane thereof; a dielectric layer formed in contact with the magnetic free layer opposite the insulating tunnel junction layer; and a first conductive layer formed in contact with the dielectric layer opposite the magnetic free layer.

19 Claims, 7 Drawing Sheets

ELECTRIC FIELD ASSISTED MRAM AND METHOD FOR USING THE SAME

CROSS-REFERENCE TO RELATED APPLICATIONS

The present application claims the benefit of the provisional application bearing Ser. No. 61/771,523 filed Mar. 1, 2013, entitled "Bi-Directional Electrical Field Assisted Switching with Ferroelectric/Dielectric Layer in Adjacent with Free Layer."

BACKGROUND

The present invention relates to a spin transfer torque magnetic random access memory (STT-MRAM) device, and more particularly, to a memory element of the STT-MRAM device including a dielectric layer for generating electric field to assist switching.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of an appropriate voltage or current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 12 and a magnetic free layer 14 with an insulating tunnel junction layer 16 interposed therebetween, thereby collectively forming a magnetic tunneling junction (MTJ) 18. The magnetic reference layer 12 and free layer 14 have magnetization directions 20 and 22, respectively, which are substantially perpendicular to the layer plane. Therefore, the MTJ 18 is a perpendicular type comprising the magnetic layers 12 and 14 with perpendicular anisotropy. Upon application of a switching current through the perpendicular MTJ 18, the magnetization direction 22 of the magnetic free layer 14 can be switched between two directions: parallel and anti-parallel with respect to the magnetization direction 20 of the magnetic reference layer 12. The insulating tunnel junction layer 16 is normally made of an insulating material with a thickness ranging from a few to a few tens of angstroms. However, when the magnetization directions 22 and 20 of the magnetic free layer 14 and reference layer 12 are substantially parallel, electrons polarized by the magnetic reference layer 12 can tunnel through the insulating tunnel junction layer 16, thereby decreasing the electrical resistivity of the perpendicular MTJ 18. Conversely, the electrical resistivity of the perpendicular MTJ 18 is high when the magnetization directions 20 and 22 of the magnetic reference layer 12 and free layer 14 are substantially anti-parallel. Accordingly, the stored logic in the magnetic memory element can be switched by changing the magnetization direction 22 of the magnetic free layer 14.

A recent study by Wang et al. on perpendicular MTJ shows that the perpendicular anisotropy of magnetic layers in magnesium oxide (MgO) based MTJ structures can be changed by the voltage applied to the magnetic layers. See Wei-Gang Wang et al., "Electric-field-assisted switching in magnetic tunnel junctions," Nature Materials Vol. 11, 64-68 (2012).

In the test set-up of Wang et al. as shown in FIG. 1, a positive electric potential is applied to the MTJ 18 to drive electrons into the magnetic free layer 14 made of 1.6 nm thick $Co_{40}Fe_{40}B_{20}$. When the insulating tunnel junction layer 16, which is made of 1.4 nm thick magnesium oxide (MgO), is sufficiently thick and electrical resistance across the MgO junction layer 16 is sufficiently high, the current density through the MgO junction layer 16 will be low. In this case, the magnetic reference layer 12, which is made of 1.3 nm thick $Co_{40}Fe_{40}B_{20}$, and the magnetic free layer 14 adjacent to the MgO junction layer 16 effectively form a parallel plate capacitor with the MgO junction layer 16 acts as the dielectric. When a voltage is applied to the MTJ 18, electrical charges will accumulate in the two magnetic layers 12 and 14 like a capacitor, resulting in formation of an electric field 24 across the MgO junction layer 16. The applied positive voltage as shown in FIG. 1 causes the magnetic free layer 14 to have a negative potential, i.e. electron accumulation at the interface between the magnetic free layer 14 and the MgO junction layer 16. With increasing applied voltage and electron accumulation at the interface, the magnetic free layer 14 shows decreasing perpendicular anisotropy, which is reflected by decreasing coercivity field Hc. The decreasing of perpendicular anisotropy and corresponding coercivity field would facilitate the switching of the variable magnetization direction 22 of the magnetic free layer 14 from parallel to anti-parallel orientation. In contrast, electrons will be depleted at the interface between the magnetic reference layer 12 and the MgO junction layer 16 with increasing applied voltage, resulting in increasing perpendicular anisotropy and coercivity field for the magnetic reference layer 12. It should be noted that Wang's finding can only be used to help switching the variable magnetic moment 22 of the magnetic free layer 14 from parallel to anti-parallel orientation, not the other way, i.e. anti-parallel to parallel orientation.

A possible explanation of the observed changes in perpendicular anisotropy with electron accumulation/depletion at interfaces between magnetic free layer/MgO junction layer/magnetic reference layer as reported by Wang et al. may be that having increased amount of electrons at the interface between the magnetic free layer 14 and the MgO junction layer 16 allows more conductive electrons to fill the 3d-band of CoFe lattice and reduce the unpaired 3d-valence electron population, thereby making the broken-symmetry induced surface perpendicular anisotropy weaker and the magnetic free layer 14 magnetically softer. When 3d-electrons are depleted at the interface between the magnetic reference layer 12 and the MgO junction layer 16, electrons will be depleted first from paired 3d-electrons according to Hunt's Rules. As more 3d-electrons become unpaired in the magnetic reference layer 12, the surface perpendicular anisotropy thereof increases, making the magnetic reference layer 12 magnetically harder to switch by external field or spin transfer torque.

While a conventional MTJ having an MgO junction layer can exhibit the above-described electric field assisted switching effect, the effect is not significant because the MgO junction layer is thin enough to allow a relatively high density of electrons to tunnel therethrough, thereby minimizing the capacitive effect needed to generate electrons at the interface between the magnetic layer and the MgO junction layer. Increasing the MgO thickness can improve the capacitive effect but would also adversely increase the MTJ resistance. Moreover, the prior art method illustrated in FIG. 1 can only help switching a magnetic free layer from parallel to anti-parallel orientation, i.e. low resistance to high resistance state.

For the foregoing reasons, there is a need for an STT-MRAM device having MTJ memory elements that can be easily switched and a method for switching the memory elements between low and high resistance state.

SUMMARY

The present invention is directed to an STT-MRAM device that satisfy this need. An STT-MRAM device having features of the present invention comprises a plurality of memory elements. Each of the plurality of memory elements comprises a magnetic reference layer with a first invariable magnetization direction substantially perpendicular to layer plane thereof; a magnetic free layer separated from the magnetic reference layer by an insulating tunnel junction layer with the magnetic free layer having a variable magnetization direction substantially perpendicular to layer plane thereof; a dielectric layer formed in contact with the magnetic free layer opposite the insulating tunnel junction layer; and a first conductive layer formed in contact with the dielectric layer opposite the magnetic free layer.

According to another aspect of the present invention as applied to a perpendicular MTJ memory element of an STT-MRAM device, the memory element comprises a magnetic reference layer with a first invariable magnetization direction substantially perpendicular to layer plane thereof; a magnetic free layer separated from the magnetic reference layer by an insulating tunnel junction layer with the magnetic free layer having a variable magnetization direction substantially perpendicular to layer plane thereof; a magnesium oxide layer formed in contact with the magnetic free layer opposite the insulating tunnel junction layer; a dielectric layer formed adjacent to the magnesium oxide layer opposite the magnetic free layer; and a first conductive layer formed in contact with the dielectric layer opposite the magnesium oxide layer.

According to still another aspect of the present invention as applied to a method for switching the resistance state of a perpendicular MTJ memory element of an STT-MRAM device, the method comprises the steps of applying a first voltage pulse to the memory element and then instantly applying a second voltage pulse with opposite polarity to the first voltage pulse to the memory element.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features, including method steps, of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

Figure 2:
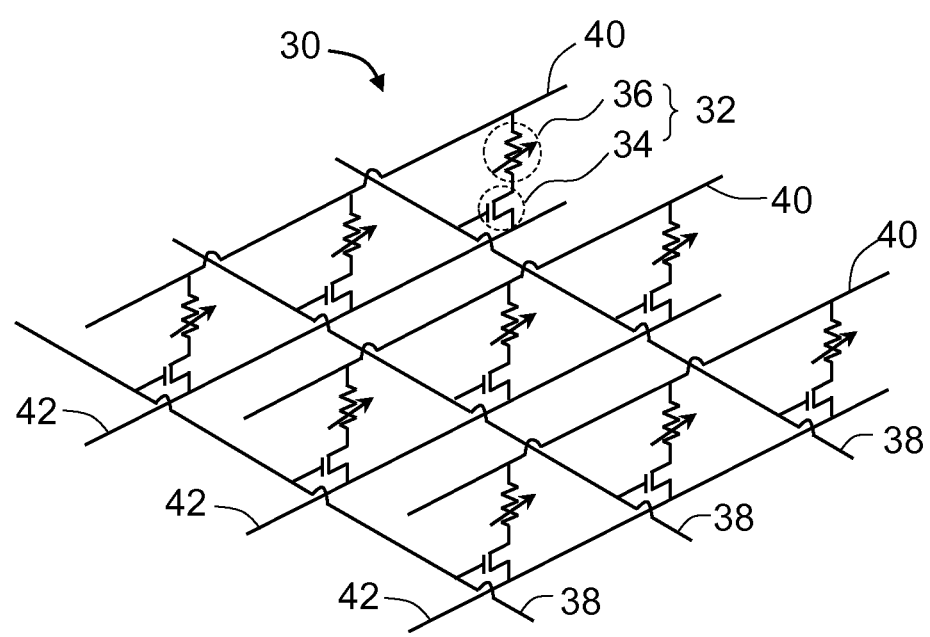
FIG. 2 is a schematic view of a circuit diagram of an STT-MRAM device according to an embodiment of the present invention.

FIG. 2 is a schematic circuit diagram of an STT-MRAM device 30 according to an embodiment of the present invention. The STT-MRAM device 30 comprises a plurality of memory cells 32, each of the memory cells 32 including a selection transistor 34 coupled to a MTJ memory element 36; a plurality of parallel word lines 38 with each being coupled to a respective row of the selection transistors 34 in a first direction; and a plurality of parallel bit lines 40 with each being coupled to a respective row of the memory elements 36 in a second direction perpendicular to the first direction; and optionally a plurality of parallel source lines 42 with each being coupled to a respective row of the selection transistors 34 in the first or second direction.

Figure 3A:
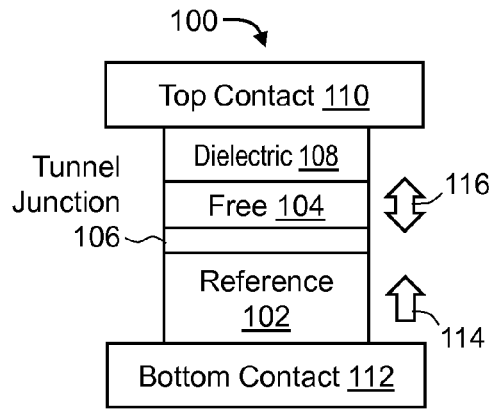
FIGS. 3A and 3B are cross sectional views of an embodiment of the present invention as applied to a perpendicular MTJ memory element.

An embodiment of the present invention as applied to a perpendicular MTJ memory element will now be described with reference to FIG. 3A. Referring now to FIG. 3A, the illustrated memory element 100 comprises a magnetic reference layer 102 and a magnetic free layer 104 on top with an insulating tunnel junction layer 106 interposed therebetween, a dielectric layer 108 formed on top of the magnetic free layer 104, and a top contact 110 formed on top of the dielectric layer 108. The perpendicular MTJ memory element 100 may optionally include a bottom contact 112 in contact with the magnetic reference layer 102 formed thereon. The magnetic reference layer 102 has a first invariable magnetization direction 114 substantially perpendicular to the layer plane thereof. The magnetic free layer 104 has a variable magnetization direction 116 substantially perpendicular to the layer plane thereof. When a voltage is applied to the memory element 100, the top contact 110 and the magnetic free layer 104 with the dielectric layer 108 interposed therebetween would behave like a parallel plate capacitor. Opposite charges will accumulate at the interface between the top contact 110 and the dielectric layer 108 and at the interface between the dielectric layer 108 and the magnetic free layer 104, thereby generating an electric field across the dielectric layer 108. The top contact 110 may be replaced with another conductive layer, such as a top electrode, a cap layer, or a magnetic layer, that can function as an electrode of a capacitor.

Figure 3B:
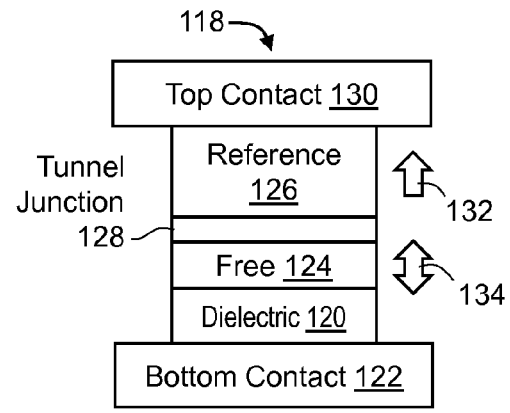

The stacking order of the individual layers 102-108 of the memory element 100 may be inverted as illustrated in FIG. 3B without affecting the device performance. The memory element 118 of FIG. 3B has the same layers but with the inverted stacking order comparing to the memory element 100. Referring to FIG. 3B, the perpendicular MTJ memory element 118 comprises a dielectric layer 120 formed on top of a bottom contact 122, a magnetic free layer 124 formed on top of the dielectric layer 120, and a magnetic reference layer 126 formed on top of the magnetic free layer 124 with an insulating tunnel junction layer 128 interposed therebetween. An optional top contact 130 may be formed on top of the magnetic reference layer 126. The magnetic reference layer 126 has a first invariable magnetization direction 132 substantially perpendicular to the layer plane thereof. The magnetic free layer 124 has a variable magnetization direction 134 substantially perpendicular to the layer plane thereof. When a voltage is applied to the memory element 118, the bottom contact 122 and the magnetic free layer 124 with the dielectric layer 120 interposed therebetween would behave like a parallel plate capacitor. The bottom contact 122 may be replaced with another conductive layer, such as a bottom electrode, a seed layer, or a magnetic layer, that can function as an electrode of a capacitor.

Figure 4A:
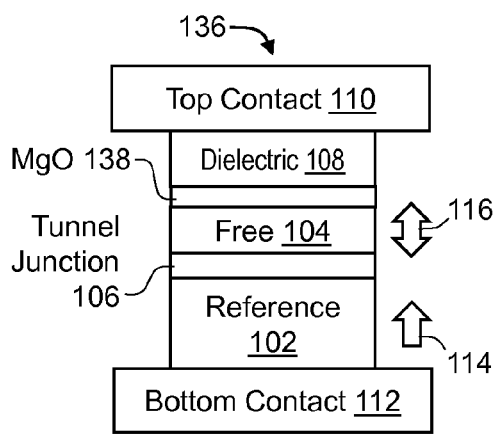
FIGS. 4A and 4B are cross sectional views of another embodiment of the present invention as applied to a perpendicular MTJ memory element.

Another embodiment of the present invention as applied to a perpendicular MTJ memory element is illustrated in FIG. 4A. The memory element 136 of FIG. 4A differs from the memory element 100 of FIG. 3A in that an MgO layer 138 has been inserted between the magnetic free layer 104 and the dielectric layer 108 to improve the perpendicular anisotropy of the free layer 104 in subsequent annealing process. The memory element 136 comprises the magnetic reference layer 102 and the magnetic free layer 104 on top with the insulating tunnel junction layer 106 interposed therebetween, the MgO layer 138 formed on top of the magnetic free layer 104, the dielectric layer 108 formed on top of the MgO layer 138, and the top contact 110 formed on top of the dielectric layer 108. The perpendicular MTJ memory element 136 may optionally include the bottom contact 112 in contact with the magnetic reference layer 102 formed thereon. The magnetic reference layer 102 has the first invariable magnetization direction 114 substantially perpendicular to the layer plane thereof. The magnetic free layer 104 has the variable magnetization direction 116 substantially perpendicular to the layer plane thereof. When a voltage is applied to the memory element 136, the top contact 110 and the magnetic free layer 104 with the MgO layer 138 and the dielectric layer 108 interposed therebetween would behave like a parallel plate capacitor. Opposite charges will accumulate at the interface between the top contact 110 and the dielectric layer 108 and at the interface between the MgO layer 138 and the magnetic free layer 104, thereby generating an electric field across the MgO layer 138 and the dielectric layer 108. The top contact 110 may be replaced with another conductive layer, such as a top electrode, a cap layer, or a magnetic layer, that can function as an electrode of a capacitor.

Figure 4B:
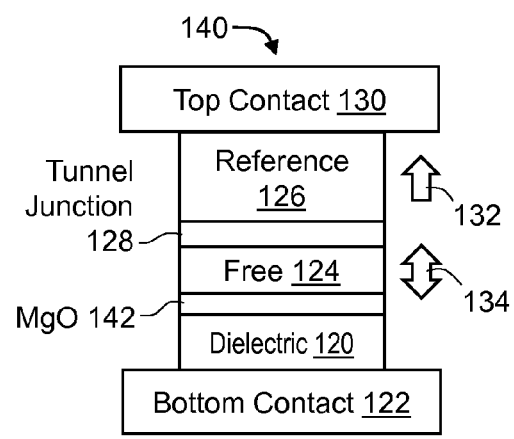

The stacking order of the individual layers 102-108 and 138 of the memory element 136 may be inverted as illustrated in FIG. 4B without affecting the device performance. The memory element 140 of FIG. 4B differs from the memory element 118 of FIG. 3B in that an MgO layer 142 has been inserted between the magnetic free layer 124 and the dielectric layer 120 to improve the perpendicular anisotropy of the magnetic free layer 124 in subsequent annealing process. Referring to FIG. 4B, the perpendicular MTJ memory element 140 comprises the dielectric layer 120 formed on top of the bottom contact 122, the MgO layer 142 formed on top of the dielectric layer 120, the magnetic free layer 124 formed on top of the MgO layer 142, the magnetic reference layer 126 formed on top of the magnetic free layer 124 with the insulating tunnel junction layer 128 interposed therebetween. The optional top contact 130 may be formed on top of the magnetic reference layer 126. The magnetic reference layer 126 has the first invariable magnetization direction 132 substantially perpendicular to the layer plane thereof. The magnetic free layer 124 has the variable magnetization direction 134 substantially perpendicular to the layer plane thereof. When a voltage is applied to the memory element 140, the bottom contact 122 and the magnetic free layer 124 with the MgO layer 142 and the dielectric layer 120 interposed therebetween would behave like a parallel plate capacitor. The bottom contact 122 may be replaced with another conductive layer, such as a bottom electrode, a seed layer, or a magnetic layer, that can function as an electrode of a capacitor.

Figure 5A:
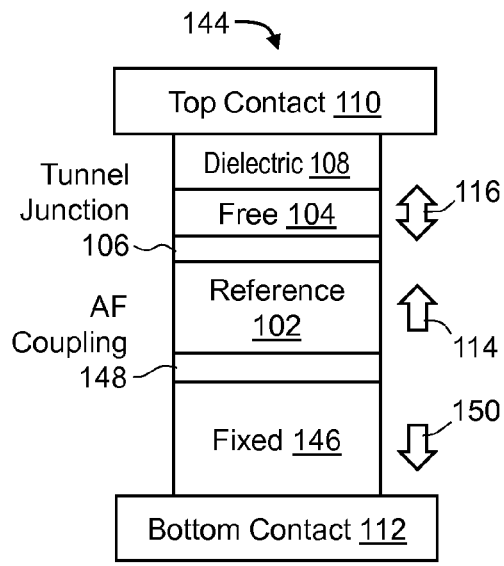
FIGS. 5A and 5B are cross sectional views of still another embodiment of the present invention as applied to a perpendicular MTJ memory element.

Still another embodiment of the present invention as applied to a perpendicular MTJ memory element is illustrated in FIG. 5A. The memory element 144 of FIG. 5A differs from the memory element 100 of FIG. 3A in that a magnetic fixed layer 146 is anti-ferromagnetically coupled to the magnetic reference layer 102 via an anti-ferromagnetic coupling layer 148. Referring to FIG. 5A, the memory element 144 comprises the magnetic reference layer 102 formed on top of the magnetic fixed layer 146 with the anti-ferromagnetic coupling layer 148 interposed therebetween, the magnetic free layer 104 formed on top of the magnetic reference layer 102 with the insulating tunnel junction layer 106 interposed therebetween, the dielectric layer 108 formed on top of the magnetic free layer 104, and a top contact 110 formed on top of the dielectric layer 108. The perpendicular MTJ memory element 144 may optionally include the bottom contact 112 in contact with the magnetic fixed layer 146 formed thereon. The magnetic reference layer 102 has the first invariable magnetization direction 114 substantially perpendicular to the layer plane thereof. The magnetic fixed layer 146 has a second invariable magnetization direction 150 that is substantially perpendicular to the layer plane thereof and is opposite the first invariable magnetization direction 114. The magnetic free layer 104 has a variable magnetization direction 116 substantially perpendicular to the layer plane thereof. When a voltage is applied to the memory element 144, the top contact 110 and the magnetic free layer 104 with the dielectric layer 108 interposed therebetween would behave like a parallel plate capacitor. Opposite charges will accumulate at the interface between the top contact 110 and the dielectric layer 108 and at the interface between the dielectric layer 108 and the magnetic free layer 104, thereby generating an electric field across the dielectric layer 108. The top contact 110 may be replaced with any conductive layer, such as a top electrode, a cap layer, or a magnetic layer, that can function as an electrode of a capacitor.

Figure 5B:
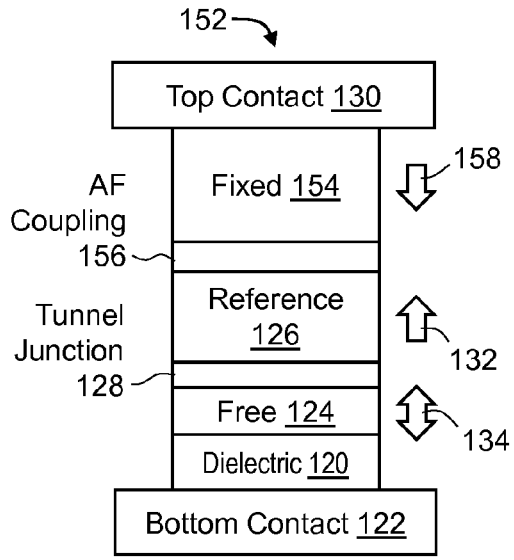

The stacking order of the individual layers 102-108, 146, and 148 of the memory element 144 may be inverted as illustrated in FIG. 5B without affecting the device performance. The memory element 152 of FIG. 5B differs from the memory element 118 of FIG. 3B in that a magnetic fixed layer 154 is anti-ferromagnetically coupled to the magnetic reference layer 126 via an anti-ferromagnetic coupling layer 156. Referring to FIG. 5B, the perpendicular MTJ memory element 152 comprises the dielectric layer 120 formed on top of the bottom contact 122, the magnetic free layer 124 formed on top of the dielectric layer 120, the magnetic reference layer 126 formed on top of the magnetic free layer 124 with the insulating tunnel junction layer 128 interposed therebetween, and a magnetic fixed layer 154 formed on top of the magnetic reference layer 126 with the anti-ferromagnetic coupling layer 156 interposed therebetween. An optional top contact 130 may be formed on top of the magnetic fixed layer 154. The magnetic reference layer 126 has the first invariable magnetization direction 132 substantially perpendicular to the layer plane thereof. The magnetic fixed layer 154 has a second invariable magnetization direction 158 that is substantially perpendicular to the layer plane thereof and is opposite the first invariable magnetization direction 132. The magnetic free layer 124 has the variable magnetization direction 134 substantially perpendicular to the layer plane thereof. When a voltage is applied to the memory element 152, the bottom contact 122 and the magnetic free layer 124 with the dielectric layer 120 interposed therebetween would behave like a parallel plate capacitor. The bottom contact 122 may be replaced with any conductive layer, such as a bottom electrode, a seed layer, or a magnetic layer, that can function as an electrode of a capacitor.

Figure 6A:
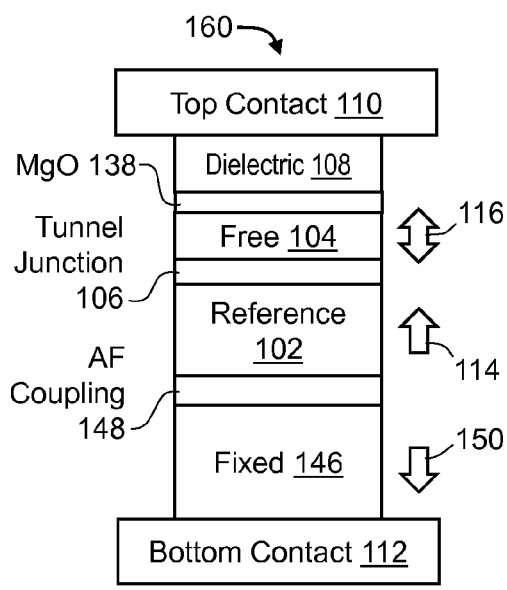
FIGS. 6A and 6B are cross sectional views of yet another embodiment of the present invention as applied to a perpendicular MTJ memory element.

Yet another embodiment of the present invention as applied to a perpendicular MTJ memory element is illustrated in FIG. 6A. The memory element 160 of FIG. 6A differs from the memory element 144 of FIG. 5A in that the MgO layer 138 has been inserted between the magnetic free layer 104 and the dielectric layer 108 to improve the perpendicular anisotropy of the magnetic free layer 104 in subsequent annealing process. Referring to FIG. 6A, the perpendicular MTJ memory element 160 comprises the magnetic reference layer 102 formed on top of the magnetic fixed layer 146 with the anti-ferromagnetic coupling layer 148 interposed therebetween, the magnetic free layer 104 formed on top of the magnetic reference layer 102 with the insulating tunnel junction layer 106 interposed therebetween, the MgO layer 138 formed on top of the magnetic free layer 104, the dielectric layer 108 formed on top of the MgO layer 138, and a top contact 110 formed on top of the dielectric layer 108. The perpendicular MTJ memory element 160 may optionally include the bottom contact 112 in contact with the magnetic fixed layer 146 formed thereon. The magnetic reference layer 102 has the first invariable magnetization direction 114 substantially perpendicular to the layer plane thereof. The magnetic fixed layer 146 has the second invariable magnetization direction 150 that is substantially perpendicular to the layer plane thereof and is opposite the first invariable magnetization direction 114. The magnetic free layer 104 has a variable magnetization direction 116 substantially perpendicular to the layer plane thereof. When a voltage is applied to the memory element 160, the top contact 110 and the magnetic free layer 104 with the MgO layer 138 and the dielectric layer 108 interposed therebetween would behave like a parallel plate capacitor. Opposite charges will accumulate at the interface between the top contact 110 and the dielectric layer 108 and at the interface between the MgO layer 138 and the magnetic free layer 104, thereby generating an electric field across the MgO layer 138 and the dielectric layer 108. The top contact 110 may be replaced with any conductive layer, such as a top electrode, a cap layer, or a magnetic layer, that can function as an electrode of a capacitor.

Figure 6B:
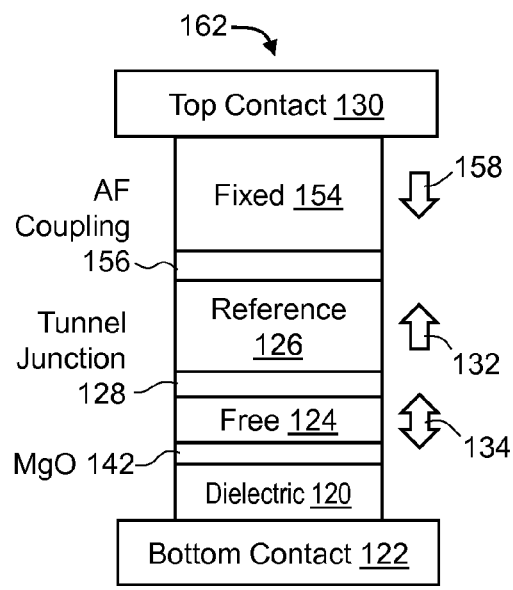

The stacking order of the individual layers 102-108, 138, 146, and 148 of the memory element 160 may be inverted as illustrated in FIG. 6B without affecting the device performance. The memory element 162 of FIG. 6B differs from the memory element 152 of FIG. 5B in that the MgO layer 142 has been inserted between the magnetic free layer 124 and the dielectric layer 120 to improve the perpendicular anisotropy of the magnetic free layer 124 in subsequent annealing process. The perpendicular MTJ memory element 162 of FIG. 6B comprises the dielectric layer 120 formed on top of the bottom contact 122, the MgO layer 142 formed on top of the dielectric layer 120, the magnetic free layer 124 formed on top of the MgO layer 142, the magnetic reference layer 126 formed on top of the magnetic free layer 124 with the insulating tunnel junction layer 128 interposed therebetween, and the magnetic fixed layer 154 formed on top of the magnetic reference layer 126 with the anti-ferromagnetic coupling layer 156 interposed therebetween. The optional top contact 130 may be formed on top of the magnetic fixed layer 154. The magnetic reference layer 126 has the first invariable magnetization direction 132 substantially perpendicular to the layer plane thereof. The magnetic fixed layer 154 has the second invariable magnetization direction 158 that is substantially perpendicular to the layer plane thereof and is opposite the first invariable magnetization direction 132. The magnetic free layer 124 has the variable magnetization direction 134 substantially perpendicular to the layer plane thereof. When a voltage is applied to the memory element 162, the bottom contact 122 and the magnetic free layer 124 with the MgO layer 142 and the dielectric layer 120 interposed therebetween would behave like a parallel plate capacitor. The bottom contact 122 may be replaced with any conductive layer, such as a bottom electrode, a seed layer, or a magnetic layer, that can function as an electrode of a capacitor.

The magnetic free layers 104 and 124 of FIGS. 3A-6A and 3B-6B may be formed of a magnetic alloy comprising a magnetic constituent and a non-magnetic constituent. The magnetic constituent may include one or more of the following elements: cobalt (Co), iron (Fe), and nickel (Ni). The non-magnetic constituent may include one or more of the following elements: boron (B), tantalum (Ta), titanium (Ti), platinum (Pt), palladium (Pd), chromium (Cr), copper (Cu), magnesium (Mg), oxygen (O), hafnium (Hf), nitrogen (N), manganese (Mn), zirconium (Zr), iridium (Ir), and silicon (Si). In an embodiment, the magnetic free layers 104 and 124 are made of a magnetic alloy comprising cobalt, iron, and boron. The magnetic free layers 104 and 124 may alternatively have a multilayer or superlattice structure formed by interleaving two different types of layers with at least one of the two types being magnetic. The first type of layers may include one or more of the following elements: Co, Fe, B, Ta, Ti, Ni, Pt, Pd, Cr, Cu, Mg, O, Hf, N, Cr, Mn, Zr, Ir, and Si. The second type of layers differ from the first type and may include one or more of the following elements or compounds: Ni, Pt, Pd, ruthenium (Ru), Ta, Ti, Cr, Cu, Mg, Hf, Cr, Mn, Zr, Ir, Si, carbon (C), MgO, aluminum oxide, zinc oxide, tantalum oxide, titanium oxide, chromium oxide, and copper oxide.

The magnetic reference layer 102 and 126 of FIGS. 3A-6A and 3B-6B may be formed of a magnetic alloy comprising a magnetic constituent and a non-magnetic constituent. The magnetic constituent may include one or more of the following elements: Co, Fe, and Ni. The non-magnetic constituent may include one or more of the following elements: B, Ta, Ti, Pt, Pd, Cr, Cu, Mg, O, Hf, N, Mn, Zr, Ir, and Si. In an embodiment, the magnetic reference layers 102 and 126 are made of a magnetic alloy comprising cobalt, iron, and boron. The magnetic reference layers 102 and 126 may alternatively have a multilayer or superlattice structure formed by interleaving two different types of layers with at least one of the two types being magnetic. The first type of layers may include one or more of the following elements: Co, Fe, B, Ta, Ti, Ni, Pt, Pd, Cr, Cu, Mg, O, Hf, N, Cr, Mn, Zr, Ir, and Si. The second type of layers differ from the first type and may include one or more of the following elements or compounds: Ni, Pt, Pd, Ru, Ta, Ti, Cr, Cu, Mg, Hf, Cr, Mn, Zr, Ir, Si, C, MgO, aluminum oxide, zinc oxide, tantalum oxide, titanium oxide, chromium oxide, and copper oxide.

The magnetic fixed layers 146 and 154 of FIGS. 5A-6A and 5B-6B may be formed of a magnetic alloy comprising a magnetic constituent and a non-magnetic constituent. The magnetic constituent may include one or more of the following elements: Co, Fe, and Ni. The non-magnetic constituent may include one or more of the following elements: B, Ta, Ti, Pt, Pd, Cr, Cu, Mg, O, Hf, N, Mn, Zr, Ir, and Si. In an embodiment, the magnetic fixed layers 146 and 154 are made of a magnetic alloy comprising cobalt, iron, and boron. The magnetic fixed layers 146 and 154 may alternatively have a multilayer or superlattice structure formed by interleaving two different types of layers with at least one of the two types being magnetic. The first type of layers may include one or more of the following elements: Co, Fe, B, Ta, Ti, Ni, Pt, Pd, Cr, Cu, Mg, O, Hf, N, Cr, Mn, Zr, Ir, and Si. The second type of layers differ from the first type and may include one or more of the following elements or compounds: Ni, Pt, Pd, Ru, Ta, Ti, Cr, Cu, Mg, Hf, Cr, Mn, Zr, Ir, Si, C, MgO, aluminum oxide, zinc oxide, tantalum oxide, titanium oxide, chromium oxide, and copper oxide.

The insulating tunnel junction layer 106 and 128 of FIGS. 3A-6A and FIGS. 3B-6B are made of any suitable insulating material, such as but not limited to magnesium oxide, aluminum oxide, zinc oxide, tantalum oxide, titanium oxide, copper oxide, chromium oxide, or any combination thereof. The insulating tunnel junction layers 106 and 128 are preferably made of MgO.

The anti-ferromagnetic coupling layers 148 and 156 of FIGS. 5A-6A and FIGS. 5B-6B are made of any suitable non-magnetic material, such as but not limited to Ta, Ti, Mg, Ir, Mn, Cu, gold (Au), silver (Ag), MgO, alumina, titanium nitride, tantalum nitride, or any combination thereof. The anti-ferromagnetic coupling layers 148 and 156 are preferably made of Ru or Cu.

The dielectric layers 108 and 120 of FIGS. 3A-6A and 3B-6B may be made of any suitable dielectric material having a sufficiently high relative permittivity or dielectric constant, preferably above 10. Suitable dielectric materials include but not limited to lead titanate ($PbTiO_3$), lead zirconate titanate, lead lanthanum zirconate titanate, barium titanate, lithium niobate, and combinations thereof.

Figure 7A:
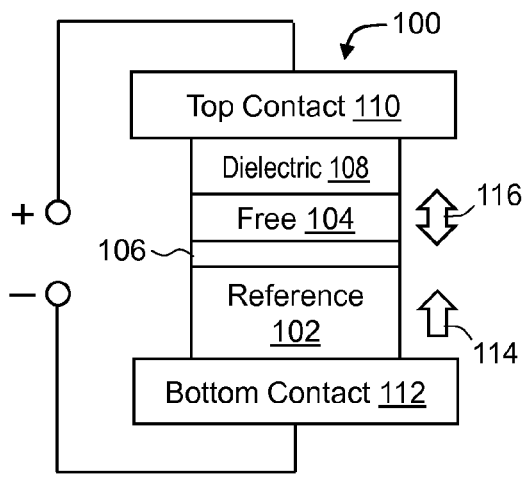
FIGS. 7A-7C illustrate an exemplary method for switching the resistance state of the memory element of FIG. 3A from high to low.

Operation of the perpendicular MTJ memory element 100 will now be described with reference to FIGS. 7-9. In the drawings numerals 100 to 116 denote the same components as those shown in FIG. 3A. FIGS. 7A-7C illustrate an exemplary method of switching the resistance state of the MTJ memory element 100 from high to low. FIG. 7A shows that a potential is applied across the MTJ memory element 100 with a positive terminal connected to the top contact 110 and a negative terminal connected to the bottom contact 112.

Figure 7B:
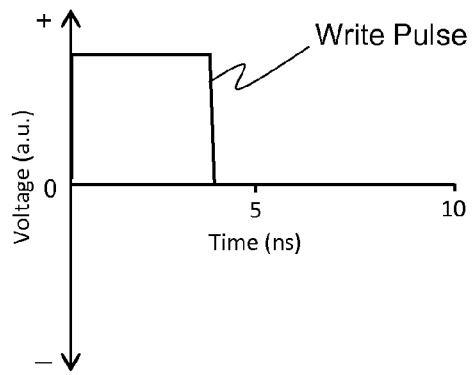

As a positive voltage pulse is applied as illustrated in FIG. 7B, a stream of electrons begins to flow upward through the MTJ memory element 100, causing electrons or negative charge to accumulate at the interface between the dielectric layer 108 and the magnetic free layer 104, thereby decreasing the perpendicular anisotropy and the coercivity field of the magnetic free layer 104. The capacitive effect is amplified when using the dielectric layer 108 with a high dielectric constant. The confluence of lowered anisotropy and coercivity of the magnetic free layer 104 and the spin transfer torque exerted by the electron stream allows the perpendicular MTJ memory element 100 to be programmed in a very energy efficient way compared to the conventional memory element illustrated in FIG. 1. The amplitude and duration of the voltage pulse would depend on properties of the memory element, such as resistance, size, and threshold for switching, and can be optimized accordingly.

Figure 7C:
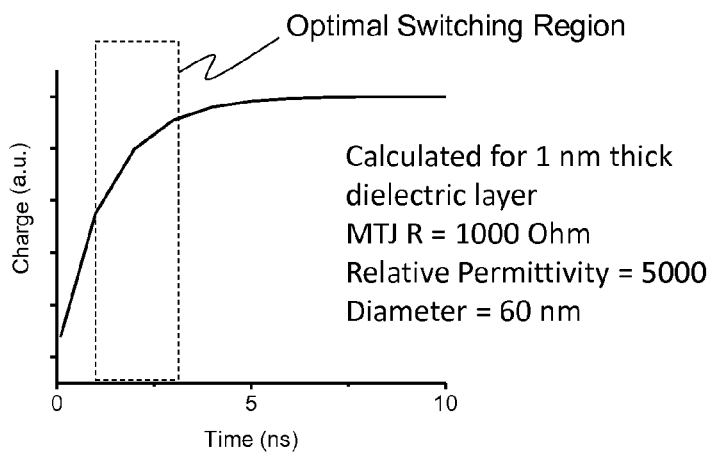

FIG. 7C shows a plot of calculated electron charge accumulation at the interface between the dielectric layer 108 and the magnetic free layer 104 corresponding to the applied positive voltage pulse in FIG. 7B for an exemplary perpendicular MTJ memory element having the listed attributes. Referring to FIG. 7C, in the beginning of the pulse, while the electron stream is high, the accumulated electron charge is low and thus the anisotropy and coercivity of the magnetic free layer 104 is not significantly lowered to facilitate switching. Toward the end of the pulse where the accumulated electron charge is almost saturated, the electron stream is limited and cannot exert a significant spin transfer torque for switching. Therefore, the optimal switching region would be somewhere between the beginning and the end of the pulse, where enough electron charge is accumulated to lower the anisotropy and coercivity of the magnetic free layer 104 while the electron stream is still flowing to exert a spin transfer torque on the magnetic free layer 104.

Figure 8A:
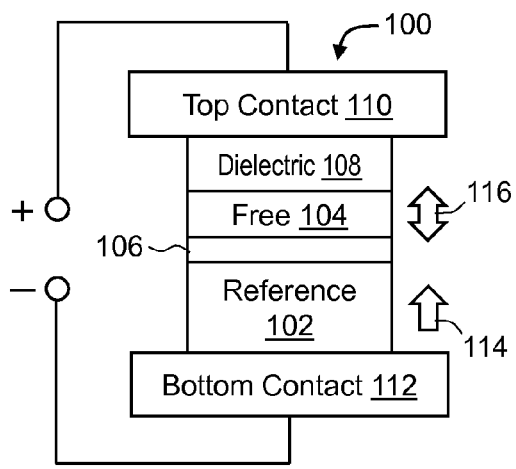
FIGS. 8A-8C illustrate an exemplary method for switching the resistance state of the memory element of FIG. 3A from low to high.
Figure 8B:
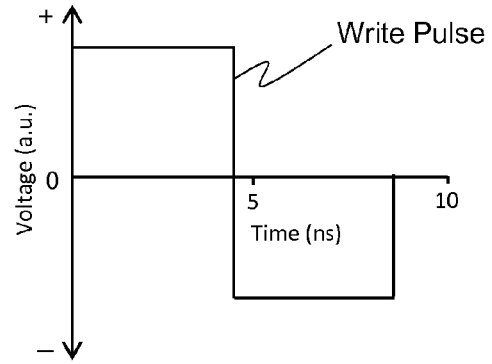
Figure 8C:
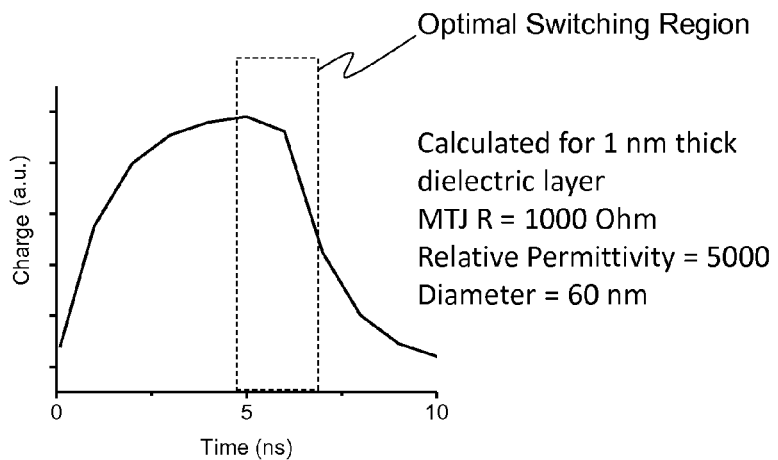

FIGS. 8A-8C illustrate an exemplary method of switching the resistance state of the MTJ memory element 100 from low to high. FIG. 8A shows that a potential is applied across the MTJ memory element 100 with a positive terminal connected to the top contact 110 and a negative terminal connected to the bottom contact 112. In contrast to switching the resistance state from high to low by applying a positive voltage pulse as described above, the use of a positive voltage pulse per se cannot switch the resistance state of the memory element 100 from low to high because the electron stream generated from a positive voltage pulse flows in opposite to the direction needed for switching the resistance state from low to high.

FIG. 8B shows the write scheme for switching the resistance state from low to high comprises a positive voltage pulse and then instantly followed by a negative voltage pulse. The positive voltage pulse is used to accumulate electrons at the interface between the dielectric layer 108 and the magnetic free layer 104, thereby lowering the anisotropy and coercivity of the magnetic free layer 104 as described above. The subsequent negative voltage pulse generates an electron stream flowing downward through the perpendicular MTJ memory element 100 as accumulated electrons at the interface between the dielectric layer 108 and the magnetic free layer 104 are depleted. The downward flowing electron stream exerts a spin transfer torque for switching the resistance state of the magnetic free layer 104 with lowered anisotropy and coercivity owing to accumulated electrons at the interface.

FIG. 8C shows a plot of calculated electron charge accumulation at the interface between the dielectric layer 108 and the magnetic free layer 104 corresponding to the applied voltage pulses in FIG. 8B for an exemplary perpendicular MTJ memory element having the listed attributes. Referring to FIG. 8C, toward the end of the positive voltage pulse, the electron charge is saturated at the interface between the dielectric layer 108 and the magnetic free layer 104, thereby maximizing the charge-induced effect of lowering the anisotropy and coercivity of the magnetic free layer 104. Immediately following the positive voltage pulse, the negative voltage pulse generates an electron stream flowing downward through the perpendicular MTJ memory element 100 as accumulated electrons at the interface between the dielectric layer 108 and the magnetic free layer 104 are depleted. Therefore, the optimal switching region would be somewhere in the beginning of the negative voltage pusle, where there is still enough electron charge accumulated at the interface from the previous positive voltage pulse and an electron stream is flowing downward through the perpendicular MTJ memory element 100 to exert a spin transfer torque on the magnetic free layer 104 for switching the magnetization direction 116 thereof from parallel to anti-parallel orientation relative to that of the magnetic reference layer 102.

Figure 9A:
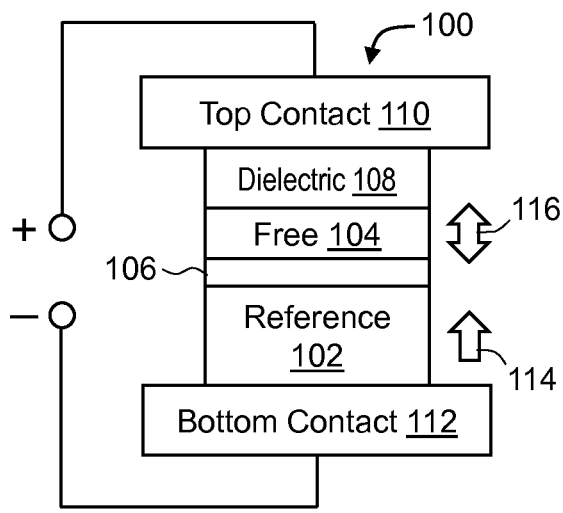
FIGS. 9A and 9B illustrate an exemplary method for sensing or reading the resistance state of the memory element of FIG. 3A.
Figure 9B:
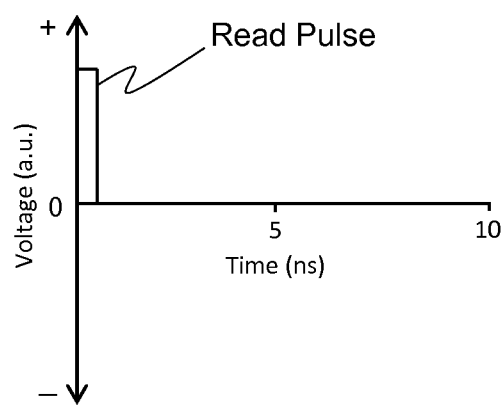

FIGS. 9A and 9B illustrate an exemplary method of reading or sensing the resistance state of the MTJ memory element 100. FIG. 9A shows that a potential is applied across the MTJ memory element 100 with a positive terminal connected to the top contact 110 and a negative terminal connected to the bottom contact 112. A positive voltage pulse with relatively lower amplitude and shorter duration may be applied to the MTJ memory element 100 to determine the resistance state thereof as illustrated in FIG. 9B. Alternatively, a negative voltage pulse with relatively short duration may also be used to read the resistance state of the perpendicular MTJ memory element 100.

The above-described method of operating the perpendicular MTJ memory element 100 may also be applied to the other memory elements 136, 144, and 160 that have the magnetic free layer 104 disposed above the magnetic reference layer 102. For the memory elements 118, 140, 152, and 162 that have the reverse stack order of the magnetic reference layer 126 above the magnetic free layer 124, the polarity of the pulses is reversed when a positive terminal is connected to the top contact 130 and a negative terminal connected to the bottom contact 122. For example, a negative voltage pulse may be used to switch the resistance state of the memory elements 118, 140, 152, and 162 from high to low. To switch the resistance state of the same elements 118, 140, 152, and 162 from low to high would require a negative voltage pulse and followed by a positive voltage pulse.

Figure 1:
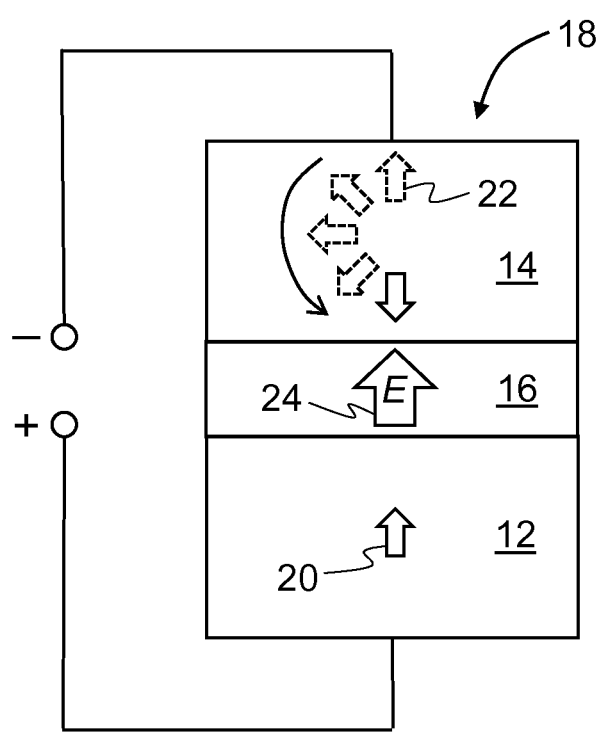
FIG. 1 is a schematic diagram of a conventional perpendicular magnetic tunnel junction with a potential applied thereto.

It should be noted that the above described method for switching the memory elements 100, 118, 136, 140, 144, 152, 160, and 162 may also be used to switch the resistance state of the conventional memory element illustrated in FIG. 1 or any memory element having a perpendicular MTJ incorporated therein with slight modifications. The prior art method provides switching of a conventional memory element in one direction using a unipolar pulse. The current invention allows the switching of the other direction using bipolar pulses. For example, the resistance state of the conventional MTJ 18 of FIG. 1 can only be switched from low to high using the prior art method of applying a positive voltage pulse. By applying a positive voltage pulse and followed by a negative voltage pulse in accordance with the present invention, the resistance state of the conventional MTJ 18 can be switched back from high to low.

All the features disclosed in this specification, including any accompanying claims, abstract, and drawings, may be replaced by alternative features serving the same, equivalent or similar purpose, unless expressly stated otherwise. Thus, unless expressly stated otherwise, each feature disclosed is one example only of a generic series of equivalent or similar features.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶ 6. In particular, the use of "step of" in the claims herein is not intended to invoke the provisions of 35 U.S.C. §112, ¶ 6.

What is claimed is:

1. A spin transfer torque magnetic random access memory (STT-MRAM) device including a plurality of memory elements, each of said plurality of memory elements comprising:
   a magnetic reference layer with a first invariable magnetization direction substantially perpendicular to a layer plane thereof;
   a magnetic free layer separated from said magnetic reference layer by an insulating tunnel junction layer, said magnetic free layer having a variable magnetization direction substantially perpendicular to a layer plane thereof;
   a dielectric layer formed in contact with said magnetic free layer opposite said insulating tunnel junction layer; and
   a first conductive layer formed in contact with said dielectric layer opposite said magnetic free layer.

2. The STT-MRAM device of claim 1, wherein each of said plurality of memory elements further comprises a second conductive layer formed in contact with said magnetic reference layer opposite said insulating tunnel junction layer.

3. The STT-MRAM device of claim 1, wherein said dielectric layer has a relative permittivity of greater than 10.

4. The STT-MRAM device of claim 1, wherein said dielectric layer is formed of a ferroelectric material.

5. The STT-MRAM device of claim 1, wherein said dielectric layer is formed of a material selected from the group consisting of lead titanate, lead zirconate titanate, lead lanthanum zirconate titanate, barium titanate, lithium niobate, and combinations thereof.

6. The STT-MRAM device of claim 1, wherein said magnetic reference layer and said magnetic free layer each is formed of an alloy comprising cobalt, iron, and boron.

7. The STT-MRAM device of claim 1, wherein at least one of said magnetic reference layer and said magnetic free layer has a multilayer structure formed by interleaving two different types of materials with at least one of said two different types being magnetic.

8. The STT-MRAM device of claim 1, wherein each of said plurality of memory elements further comprises a magnetic fixed layer separated from said magnetic reference layer by an anti-ferromagnetic coupling layer, said magnetic fixed layer has a second invariable magnetization direction that is substantially perpendicular to a layer plane thereof and is substantially opposite said first invariable magnetization direction.

9. The STT-MRAM device of claim 8, wherein each of said plurality of memory elements further comprises a second conductive layer formed in contact with said magnetic fixed layer opposite said anti-ferromagnetic coupling layer.

10. A spin transfer torque magnetic random access memory (STT-MRAM) device including a plurality of memory elements, each of said plurality of memory elements comprising:
a magnetic reference layer with a first invariable magnetization direction substantially perpendicular to a layer plane thereof;
a magnetic free layer separated from said magnetic reference layer by an insulating tunnel junction layer, said magnetic free layer having a variable magnetization direction substantially perpendicular to a layer plane thereof;
a magnesium oxide layer formed in contact with said magnetic free layer opposite said insulating tunnel junction layer;
a dielectric layer formed adjacent to said magnesium oxide layer opposite said magnetic free layer; and
a first conductive layer formed in contact with said dielectric layer opposite said magnesium oxide layer.

11. The STT-MRAM device of claim 10, wherein each of said plurality of memory elements further comprises a second conductive layer formed in contact with said magnetic reference layer opposite said insulating tunnel junction layer.

12. The STT-MRAM device of claim 10, wherein said dielectric layer has a relative permittivity of greater than 10.

13. The STT-MRAM device of claim 10, wherein said dielectric layer is formed of a ferroelectric material.

14. The STT-MRAM device of claim 10, wherein said dielectric layer is formed of a material selected from the group consisting of lead titanate, lead zirconate titanate, lead lanthanum zirconate titanate, barium titanate, lithium niobate, and combinations thereof.

15. The STT-MRAM device of claim 10, wherein said magnetic reference layer and said magnetic free layer each is formed of an alloy comprising cobalt, iron, and boron.

16. The STT-MRAM device of claim 10, wherein at least one of said magnetic reference layer and said magnetic free layer has a multilayer structure formed by interleaving two different types of materials with at least one of said two different types being magnetic.

17. The STT-MRAM device of claim 10, wherein each of said plurality of memory elements further comprises a magnetic fixed layer separated from said magnetic reference layer by an anti-ferromagnetic coupling layer, said magnetic fixed layer has a second invariable magnetization direction that is substantially perpendicular to a layer plane thereof and is substantially opposite said first invariable magnetization direction.

18. The STT-MRAM device of claim 17, wherein each of said plurality of memory elements further comprises a second conductive layer formed in contact with said magnetic fixed layer opposite said anti-ferromagnetic coupling layer.

19. A method for switching resistance state of a memory element including a perpendicular magnetic tunnel junction therein, the method comprising the steps of:
applying a first voltage pulse to said memory element; and
after applying said first voltage pulse, instantly applying a second voltage pulse with opposite polarity to said first voltage pulse to said memory element.

* * * * *